United States Patent
Matsunaga

(10) Patent No.: US 10,791,399 B2
(45) Date of Patent: Sep. 29, 2020

(54) ELECTROACOUSTIC CONVERTER, ASSEMBLY HAVING ELECTROACOUSTIC CONVERTER, AND ELECTROACOUSTIC CONVERTER APPARATUS HAVING ASSEMBLY

(71) Applicant: Foster Electric Company, Limited, Tokyo (JP)

(72) Inventor: Akinori Matsunaga, Tokyo (JP)

(73) Assignee: FOSTER ELECTRIC COMPANY, LIMITED, Tokyo (JP)

(*) Notice: Subject to any disclaimer, the term of this patent is extended or adjusted under 35 U.S.C. 154(b) by 253 days.

(21) Appl. No.: 15/575,260

(22) PCT Filed: Aug. 31, 2015

(86) PCT No.: PCT/JP2015/004397
§ 371 (c)(1),
(2) Date: Nov. 17, 2017

(87) PCT Pub. No.: WO2017/037755
PCT Pub. Date: Mar. 9, 2017

(65) Prior Publication Data
US 2018/0220234 A1    Aug. 2, 2018

(51) Int. Cl.
*H04R 3/02* (2006.01)
*H05K 1/18* (2006.01)
(Continued)

(52) U.S. Cl.
CPC ............... *H04R 3/02* (2013.01); *H04R 1/021* (2013.01); *H04R 1/04* (2013.01); *H04R 1/34* (2013.01);
(Continued)

(58) Field of Classification Search
CPC ............ H04R 3/02; H05K 1/181; H05K 1/182
(Continued)

(56) References Cited

U.S. PATENT DOCUMENTS

2007/0040477 A1* 2/2007 Sugiura ............... B06B 1/0629
310/324

FOREIGN PATENT DOCUMENTS

| JP | 2001-230841 | 8/2001 |
|---|---|---|
| JP | 2008-135860 | 6/2008 |
| JP | 2010-193414 | 9/2010 |

OTHER PUBLICATIONS

Japanese Patent Office: PCT International Searching Authority: International Search Report and Written Opinion dated Sep. 29, 2015: entire document.

* cited by examiner

*Primary Examiner* — Derek J Rosenau
(74) *Attorney, Agent, or Firm* — Allen Dyer Doppelt & Gilchrist, PA

(57) ABSTRACT

Cylindrical ventilation ports radiating sound radiated from a rear surface of a diaphragm to an outside are projected from a rear surface of the electroacoustic converter having the diaphragm inside. A distal end of each ventilation port is located in a through hole of a circuit board, on which the electroacoustic converter is mounted, at a position farther away from the diaphragm than a contact surface of the circuit board. The distal end of each ventilation port may be in the through hole or may be protruded to the outside from the rear surface of the circuit board. As a result, since separation from the radiated sound from the front surface of the diaphragm is achieved, the radiated sound from the rear surface of the diaphragm is prevented from interfering with the radiated sound from the front surface of the diaphragm.

2 Claims, 9 Drawing Sheets

(51) Int. Cl.
  *H04R 1/04*      (2006.01)
  *H04R 1/02*      (2006.01)
  *H04R 9/02*      (2006.01)
  *H04R 1/34*      (2006.01)
  *H04M 1/03*      (2006.01)
(52) U.S. Cl.
  CPC ............... *H04R 9/02* (2013.01); *H05K 1/181* (2013.01); *H05K 1/182* (2013.01); *H04M 1/03* (2013.01); *H05K 2201/10083* (2013.01)
(58) Field of Classification Search
  USPC .................................................. 310/322, 334
  See application file for complete search history.

ELECTROACOUSTIC CONVERTER, ASSEMBLY HAVING ELECTROACOUSTIC CONVERTER, AND ELECTROACOUSTIC CONVERTER APPARATUS HAVING ASSEMBLY

FIELD OF THE INVENTION

The present invention relates to an electroacoustic converter, an assembly in which the electroacoustic converter is mounted on a surface of a circuit board, and an electroacoustic converter apparatus in which the assembly is incorporated in a housing.

BACKGROUND OF THE INVENTION

There are various electroacoustic converters and some of them, including a so-called reflow speaker, are mounted on a surface of a circuit board (Japanese Patent Laid-Open No. 2010-193414).

In this type of speakers, as illustrated in FIG. 11, a hollow frame 2', serving as a case and having sound emission holes 3' formed in an upper surface, accommodates a diaphragm which is a constituent member of an acoustic device and a magnetic circuit for driving the diaphragm and the like and is surface-mounted by reflow processing on a circuit board 12' on which cream solder is applied.

In the frame 2' of an electroacoustic converter 1, as illustrated in FIG. 12, a diaphragm 6' is provided. This diaphragm 6' is vibrated back and forth, but since a radiated sound a from the front surface and a radiated sound b from the rear surface of the diaphragm 6' have phases opposite to each other, the sound from the front surface and the sound from the rear surface need to be separated. If this separation is not sufficient, the radiated sound a from the front surface and the radiated sound b from the rear surface cancel out each other, which leads to lowering of a sound pressure. This influence is particularly remarkable when a wavelength is long (frequency is low).

In the conventional electroacoustic converter 1', as illustrated in FIG. 13 in detail, holes a' are formed from a lower part of an outer peripheral wall to a bottom surface of the frame 2'. In the case of electromagnetic type speaker, the holes a' are mainly provided for allowing air expanded by heat in the reflow processing to escape. Further, in the case of electrodynamic type speaker, the holes a' are provided for preventing the operation from being interfered by sealing of air inside the rear surface with respect to large amplitude of the diaphragm when a low sound is reproduced. However, in such a conventional example, the radiated sound b leaks through the holes a' and cannot be separated from the radiated sound a on the front side, which causes lowering of the sound pressure.

Moreover, the electroacoustic converter 1' surface-mounted on a circuit board 12' is, as illustrated in FIG. 14, accommodated inside a housing 13' for use.

In this case, in order to bring the front surface of the electroacoustic converter 1' into close contact with the housing 13', as illustrated on the right side in FIG. 14, a packing P such as PE foam or the like for absorbing dimensional tolerances of the housing 13', the circuit board 12', and the electroacoustic converter 1' is required. By use of this packing P, the separation of the sounds on the front and rear sides of the diaphragm is made possible.

On the other hand, when the packing P is not used, as illustrated on the left side in FIG. 14, a distance 1 needs to be given sufficiently between the housing 13' and the upper surface of the electroacoustic converter 1' so that a chattering sound caused by vibration during the operation is not generated.

In such mounting, as indicated by an arrow on the left side in FIG. 14, the radiated sound b from the rear surface of the diaphragm in the electroacoustic converter 1' leaks through a gap between the electroacoustic converter 1' and the circuit board 12' or the holes a' on the outer peripheral portion of the electroacoustic converter 1' and goes around the radiated sound a side on the front surface of the diaphragm, causing a state where the radiated sounds on the front and rear sides of the diaphragm cannot be separated reliably. Such a state leads to lowering of the sound pressure, and further the sound pressure can be fluctuated by variation of the gap.

SUMMARY OF THE INVENTION

The present invention has been proposed in view the above and has an object to provide an electroacoustic converter which can suppress lowering of the sound pressure, an assembly in which the electroacoustic converter is mounted on a circuit board, and an electroacoustic converting apparatus in which the assembly is incorporated in a housing.

In order to solve the aforementioned problem, according to an embodiment of the present invention, an electroacoustic converter 1 includes a diaphragm 6 in a frame 2, wherein the frame 2 has a sound emission hole 3 in an upper surface thereof for radiating a radiated sound from a front surface of the diaphragm 6 and has a terminal configured to be conductively fixed to a circuit board 12 on a lower part thereof, a cylindrical ventilation port 5 radiating a radiated sound b from a rear surface of the diaphragm 6 provided in the frame 2 is projected, and a distal end of the ventilation port is located at a position farther away from the diaphragm 6 than a contact surface with the circuit board.

According to an aspect of the present invention, an assembly includes the_electroacoustic converter 1 and the circuit board 12 on which the electroacoustic converter 1 is mounted, wherein the circuit board 12 has a through hole 12a provided for insertion of the ventilation port 5, and a distal end of the ventilation port 5 is located closer to a rear surface of the circuit board 12 than to a front surface of the circuit board 12. According to a further aspect of the present invention, an apparatus includes inside a housing 13.

When mounted on the circuit board, the distal end of the ventilation port is inserted into the through hole 12a of the circuit board 12, whereby the sound from the rear surface of the diaphragm in the electroacoustic converter 1 does not easily go around to the front surface when being mounted. In this case, by setting the distal end of the ventilation port at a position protruded from the rear surface of the circuit board 12, the radiated sound b on the rear surface of the diaphragm can be reliably radiated from the rear surface of the circuit board. Therefore, since the radiated sound a from the front surface of the diaphragm and the radiated sound b from the rear surface of the diaphragm can be separated, lowering of the sound pressure can be prevented. Without providing a packing between the housing 13 and the electroacoustic converter 1 and even if a sufficient distance is given between them, the sound pressure is not lowered or fluctuation does not occur in the sound pressure, and design freedom is increased and cost reduction can be promoted.

DETAILED DESCRIPTION OF A PREFERRED EMBODIMENT

The present invention achieves the object of separating radiated sounds on the front and rear side of a diaphragm and preventing lowering of a sound pressure by providing, on an electroacoustic converter, ventilation ports inserted into holes of a circuit board on which the electroacoustic converter is mounted, so that the radiated sound from a rear surface of the diaphragm is reliably radiated to the rear surface side of the electroacoustic converter.

Embodiment 1

Figure 1:
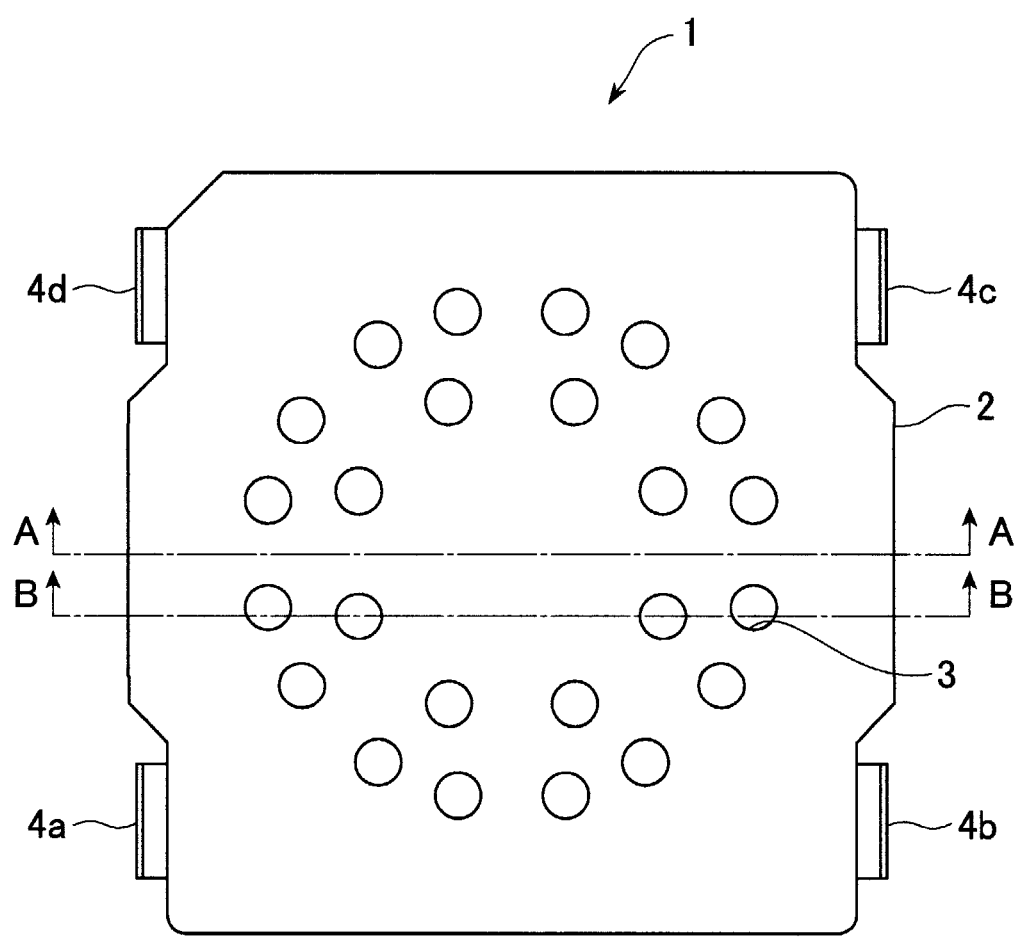
FIG. 1 is a plan view of an electroacoustic converter according to an embodiment of the present invention.
Figure 2:
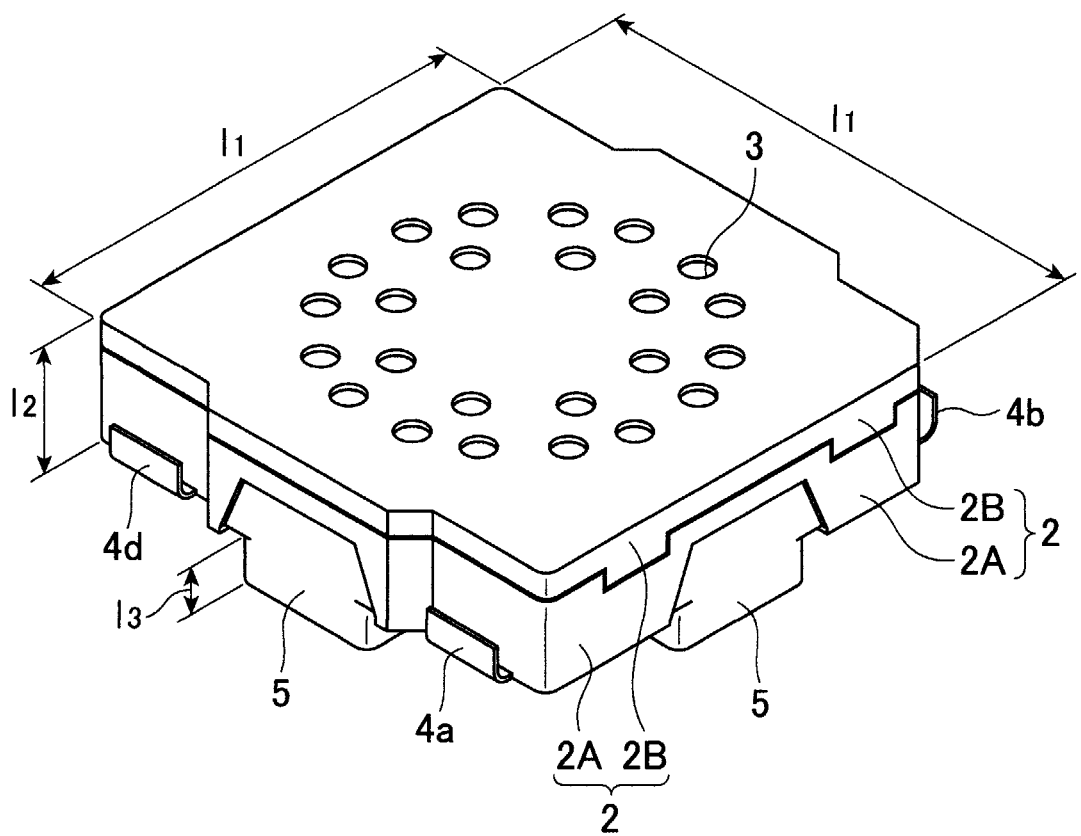
FIG. 2 is a perspective view of the electroacoustic converter of the same when seen from diagonally above.
Figure 3:
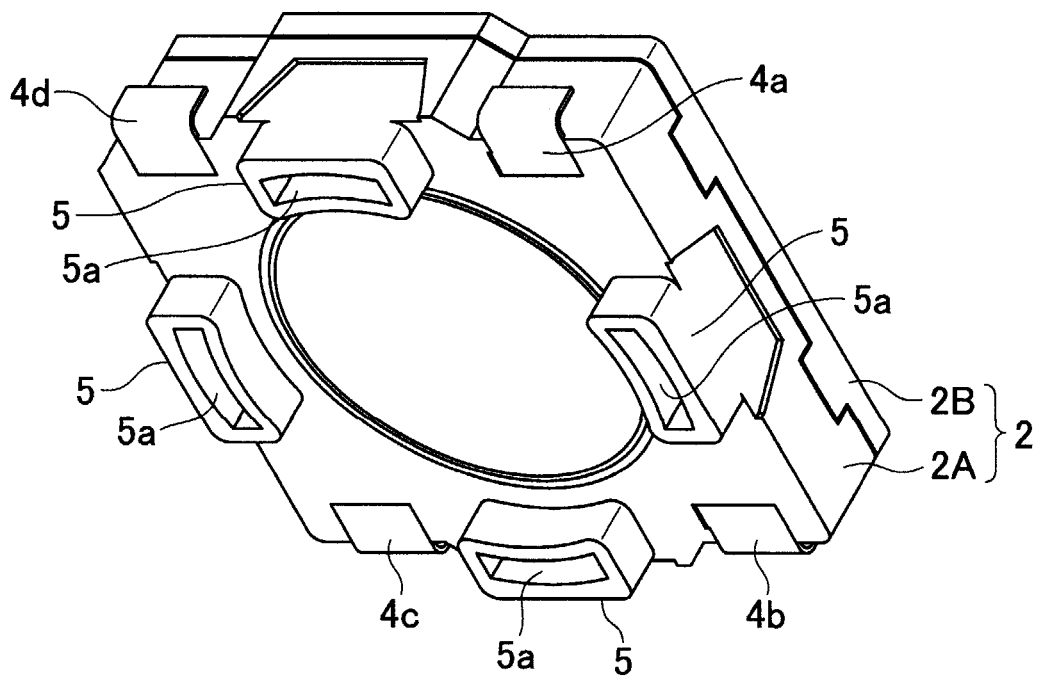
FIG. 3 is a perspective view of the electroacoustic converter of the same when seen from below.

In FIGS. 1 to 3, a frame 2 made of resin of an electroacoustic converter 1 according to an embodiment of the present invention has a space in which a diaphragm and the like can be accommodated therein and includes a lower frame 2A having a box shape with an upper part open and an upper frame 2B serving as a cover for the opening portion of this lower frame 2A. The upper frame 2B is integrated with the lower frame 2A by an adhesive or ultrasonic welding.

In an upper surface of the upper frame 2B, a plurality of sound emission holes 3 each having a circular shape and radiating a radiated sound from a front surface of a diaphragm is formed. The sound emission holes 3 are arranged in a double annular form, but the shape and arrangement of the sound emission holes 3 are not limited to the illustrated one. The upper frame 2B forms, as illustrated in FIGS. 1 and 2, a substantially regular square in plan view. A bottom surface of the lower frame 2A also forms a substantially regular square as seen from FIG. 3.

Moreover, at four corners on a lower part of the lower frame 2A, as illustrated in FIGS. 2 and 3, four terminals 4a to 4d each having an L-shaped exposed portion are provided by insert molding. In these terminals 4a to 4d, a winding start and a winding end of a lead wire (not shown) of a voice coil are connected to the terminals 4a and 4b, for example, in the frame 2. The remaining two terminals 4c and 4d are dummy terminals. The dummy terminals can be easily discriminated by applying an appropriate mark at a position corresponding to the terminal on the upper surface of the frame 2. It is needless to say that the winding start and the winding end of the lead wire may be connected to the terminals 4c and 4d and the terminals 4a and 4b may be made dummies. The number of terminals is set to four because, when the frame 2 is surface-mounted on the circuit board, soldering is performed at four spots so that the electroacoustic converter 1 can be reliably fixed to the circuit board.

Moreover, at the center of the terminals 4a to 4d on a bottom surface outer peripheral part of the lower frame 2A, square cylindrical ventilation ports 5 are formed. In each ventilation port 5, a ventilation hole 5a for allowing an internal space and an outside of the frame 2 to communicate with each other is formed so that the radiated sound b on the rear surface of the diaphragm can be radiated to the outside through the ventilation hole 5a.

Figure 4:
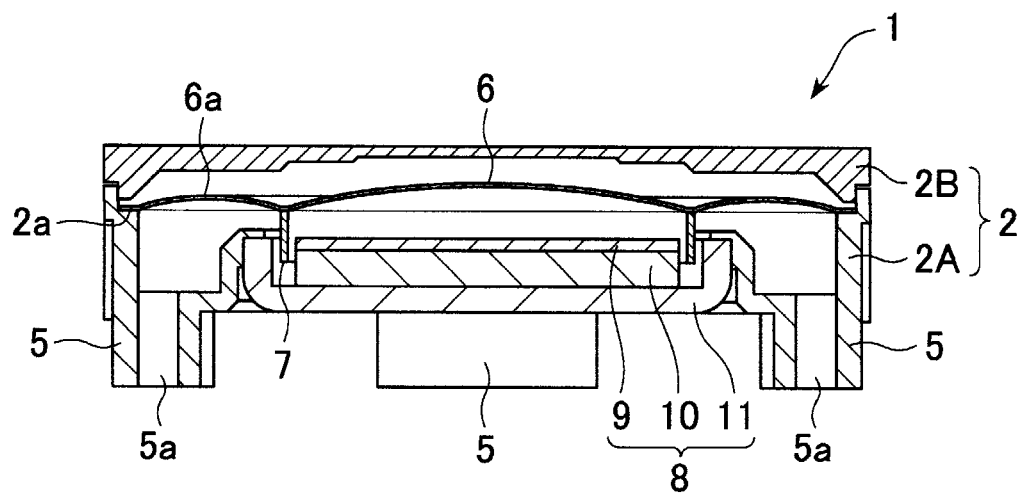
FIG. 4 is a sectional view on an A-A line in FIG. 1.
Figure 5:
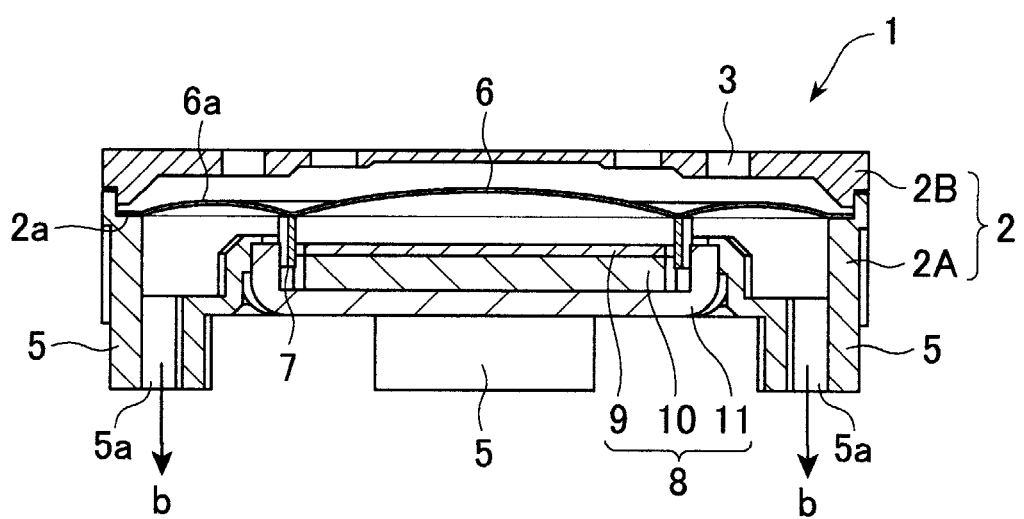
FIG. 5 is a sectional view on a B-B line in FIG. 1.

FIGS. 4 and 5 are side cross sectional views illustrating an internal structure of the electroacoustic converter 1. The diaphragm 6 is provided in the frame 2 as described above. Edges 6a on an outer periphery of the diaphragm are each fixed to a diaphragm fixing portion 2a having a stepped shape formed on an inner wall portion of the lower frame 2A by using an adhesive. Reference numeral 7 denotes a cylindrical voice coil provided on the rear surface of the diaphragm 6, and the winding start and the winding end of the lead wire are connected to the terminals 4a and 4b in the lower frame 2A as described above. Reference numeral 8 denotes a magnetic circuit for driving the voice coil 7. The magnetic circuit 8 includes a top plate 9, a magnet 10, and a yoke 11, and the voice coil 7 is located in a magnetic gap between the top plate 9 and the yoke 11 in a vibratable manner. These speaker structures are known. In FIG. 3, a member having a circular shape on a bottom surface of the lower frame 2A is a yoke bottom surface of the magnetic circuit 8 illustrated in FIG. 4.

When a voice current flows through the voice coil 7 in the magnetic gap, the voice coil 7 is driven, and the diaphragm 6 is vibrated. In this case, as indicated by an arrow in FIG. 5, the present invention is constituted such that the radiated sound b from the rear surface of the diaphragm 6 can be rapidly radiated to the outside through the linear ventilation holes 5a in the ventilation ports 5 provided facing with the rear surface of the diaphragm 6.

Figure 6:
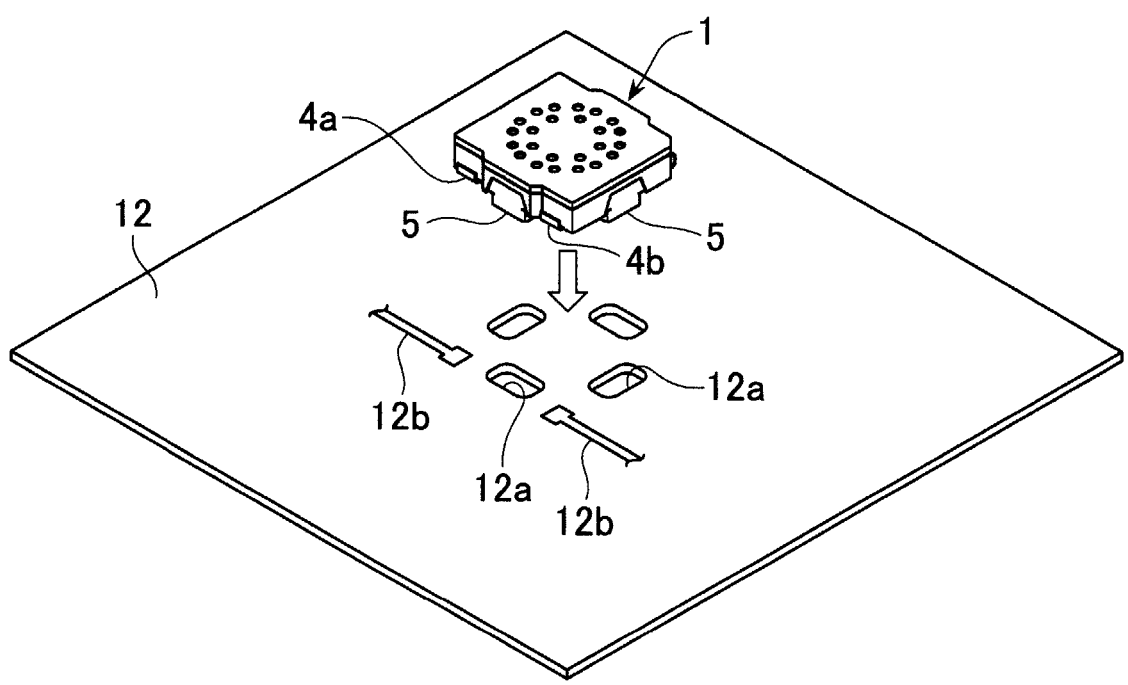
FIG. 6 is a perspective view of a state where the electroacoustic converter of the embodiment of the present invention is mounted on a circuit board.

In the circuit board 12 on which the electroacoustic converter 1 is surface-mounted, as illustrated in FIG. 6, through holes 12a into which the ventilation ports 5 are inserted are formed at respective positions corresponding to the ventilation ports 5, and the through holes 12a are also used for positioning the electroacoustic converter 1 when the electroacoustic converter 1 is to be mounted. Moreover, the terminals 4a and 4b to which the winding start and the winding end of the lead wire of the voice coil 7 are connected are conductively fixed by being connected to conductive portions 12b formed on the circuit board 12 by soldering, and the electroacoustic converter 1 is surface-mounted on the circuit board 12.

On the circuit board 12, electronic circuit components (not shown) for driving the electroacoustic converter 1 are mounted, and other desirable electronic circuits are incorporated as necessary.

Figure 7:
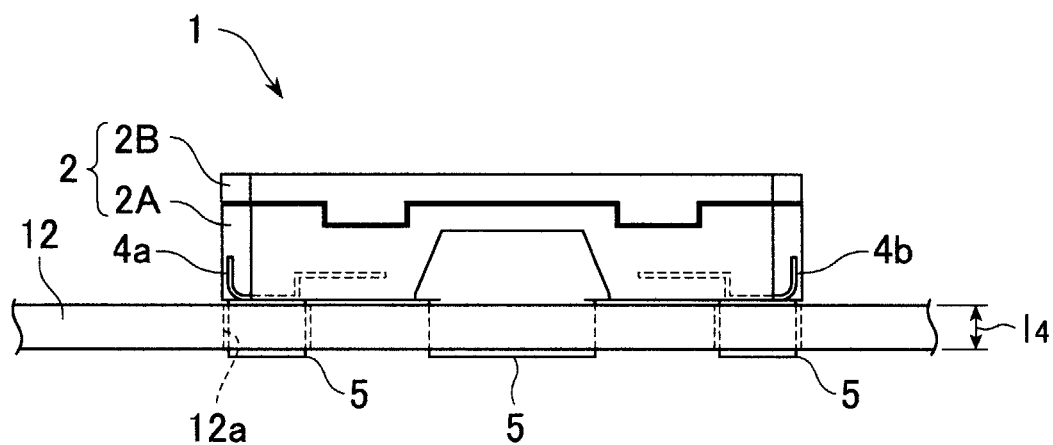
FIG. 7 is a side view of the state where the electroacoustic converter of the embodiment of the present invention is mounted on the circuit board.
Figure 12:
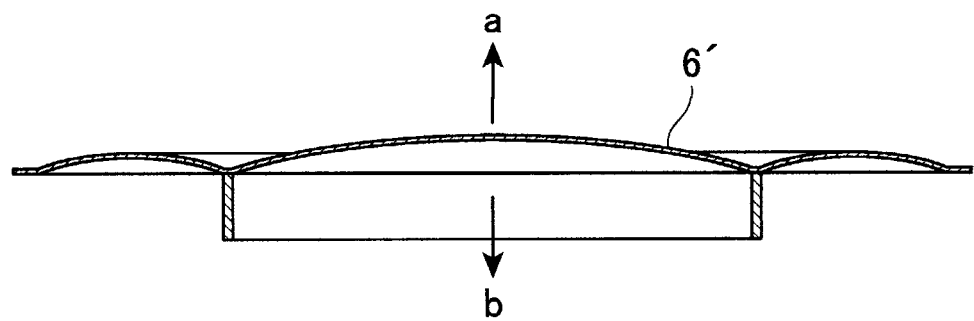
FIG. 12 is an operation explanatory view of a diaphragm of the electroacoustic converter.

FIG. 7 is a side view of a state where the electroacoustic converter 1 is surface-mounted on the circuit board 12 by reflow processing. The present invention has a feature that, after surface-mounting on the circuit board 12, a distal end of each ventilation port 5 is located at a position farther away from the diaphragm than a surface of the electroacoustic converter 1 in contact with the circuit board surface. In the illustrated example, the ventilation ports 5 penetrate the circuit board 12 and protrude downward from the circuit board rear surface, so that the radiated sound b from the rear surface of the diaphragm is radiated to the rear surface side of the circuit board 12 and separated from the radiated sound a from the front surface of the diaphragm (see FIG. 12) to prevent the sound pressure from lowering, but the present invention is not limited to this example.

Figure 8:
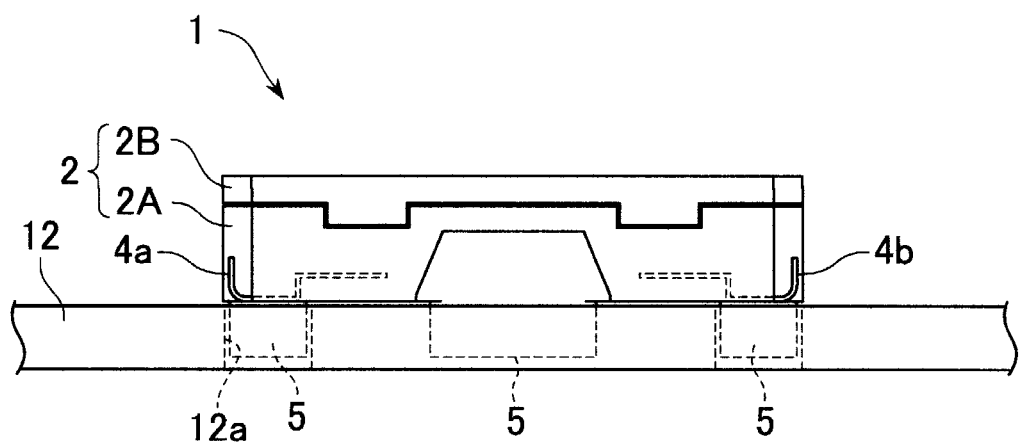
FIG. 8 is an explanatory view of the state where the electroacoustic converter of the present invention is mounted on a circuit board with a thickness.

That is, as illustrated in FIG. 8, in the case where the circuit board 12 is thick, when the ventilation ports 5 are inserted into the through holes 12*a*, the distal end of each ventilation port only needs to enter the through hole 12*a* toward the rear surface from the front surface of the circuit board. As described above, it is not necessary that the distal end of the ventilation port protrudes from the rear surface of the circuit board to the outside.

When the distal ends of the ventilation ports are located closer to the diaphragm side than the surface of the circuit board 12, leakage can easily occur from the gap between the circuit board 12 and the frame 2 to the front surface side of the diaphragm 6, and the fluctuation can occur easily depending on the state of the contact surface of each of the circuit board 12 and the frame 2. However, by locating the distal ends of the ventilation ports closer to the rear surface than the front surface of the circuit board 12 as in the present invention, the radiated sound b from the rear surface of the diaphragm can be reliably radiated to the side opposite to the mount surface of the circuit board 12, that is, to the rear surface side.

In this embodiment, a surface of the electroacoustic converter 1 in contact with the surface of the circuit board 12 is a lower surface portion of the frame 2, but in the electroacoustic converter with a component constitution equivalent to the present embodiment, the electroacoustic converter 1 can be in contact with the surface of the circuit board 12 at a yoke lower surface portion or a terminal lower surface portion depending on a desired performance, strength design or designs for improving reflow reliability and the like.

As a shape size of the electroacoustic converter 1, in FIG. 2, assuming that vertical and lateral dimensions $l_1$ of the frame 2 is 20 mm, a thickness $l_2$ is 5 mm, and a dimension $l_3$ of the ventilation port 5 protruding from the frame lower surface is 2 mm, the ventilation ports 5 enter from the front surface of the circuit board 12 in the direction away from the diaphragm 6 at least by 2 mm. Moreover, assuming that a thickness $l_4$ of the circuit board 12 is 1.6 mm, for example, in FIG. 7, the distal ends of the ventilation ports 5 can be made to protrude from the rear surface of the circuit board 12. These dimensions are only preferable examples.

An intended reproduction resource of the electroacoustic converter 1 of the present invention is mainly reproduction of a human voice, and a band of approximately 300 to 6 kHz is typically reproduced. When the present invention is to be used for the purpose of sounds of car navigation, ETC and the like, it is important to raise the sound pressure at 6 kHz or less.

Figure 9:
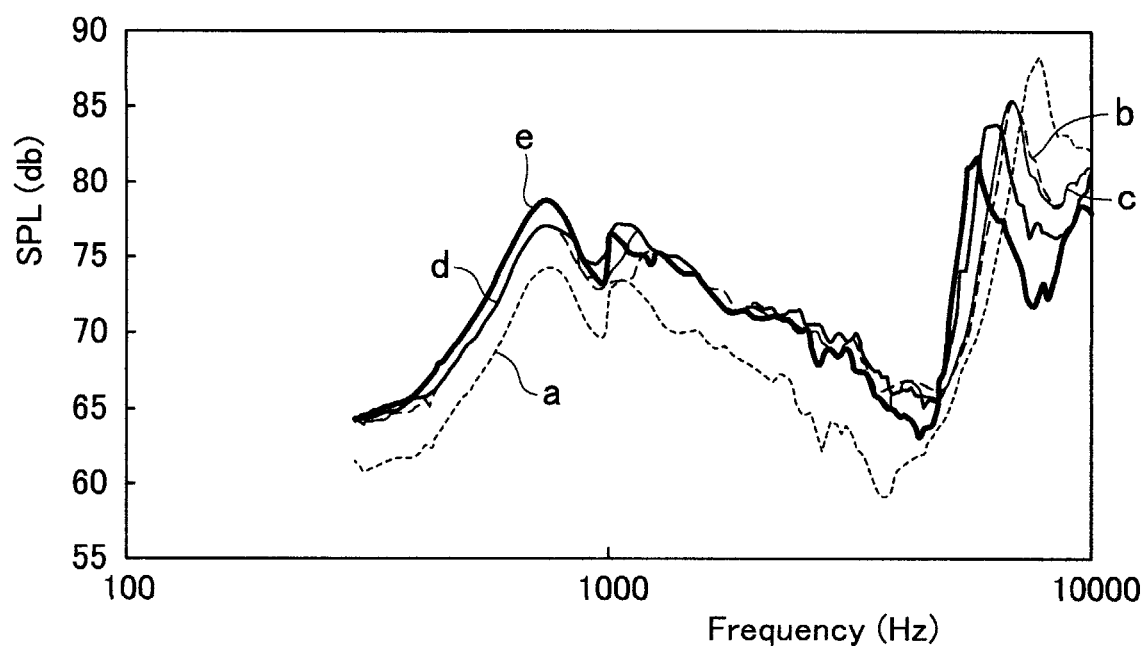
FIG. 9 is an explanatory view illustrating a sound pressure characteristic to a frequency in comparison between a prior-art example and the present invention.

FIG. 9 illustrates sound pressure characteristics to frequencies in comparison between a prior-art example and the present invention. In FIG. 9, a broken line a represents a case of the prior-art example in which the ventilation ports are not projected, while a slightly thick broken line b represents a case where frame side surface holes are closed when holes (not shown) similar to the holes 12*a* in FIG. 6 are opened in the circuit board 12' illustrated in FIG. 11. In FIG. 9, a solid line c represents a type of the electroacoustic converter 1 in which the ventilation ports 5 of the present invention are provided, and thicker solid lines d and e represent a case where lengths of the ventilation ports are made different or the like, respectively.

Figure 11:
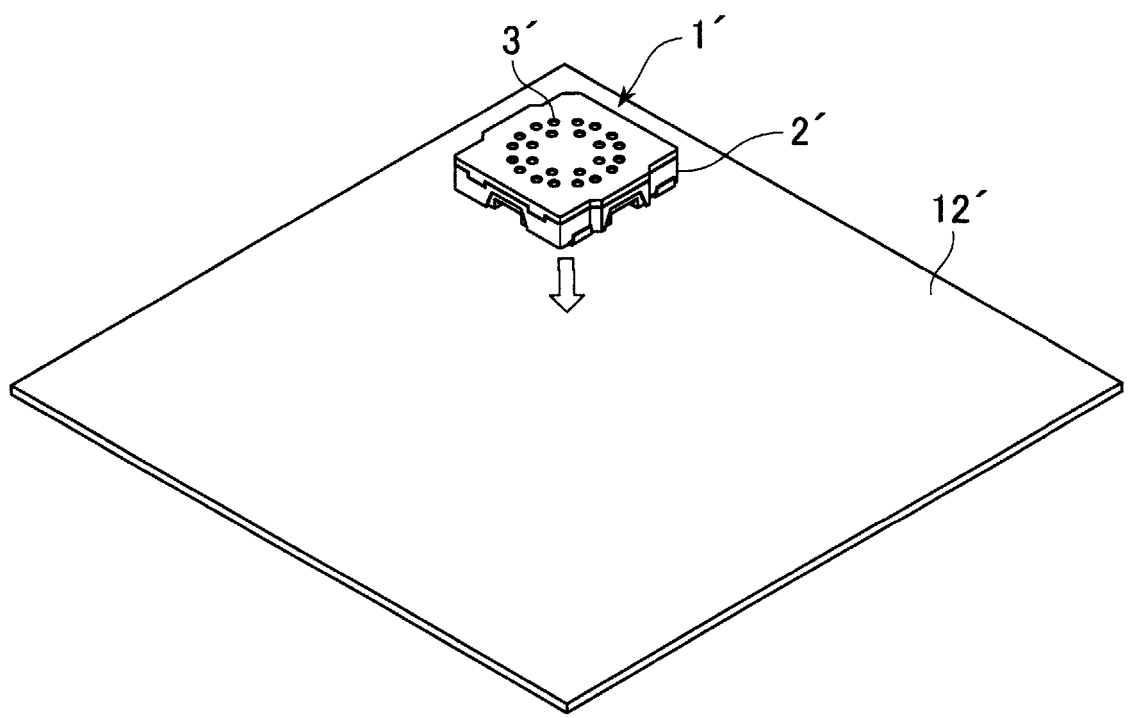
FIG. 11 is an explanatory view of a state where a prior-art electroacoustic converter is surface-mounted on the circuit board.
Figure 13:
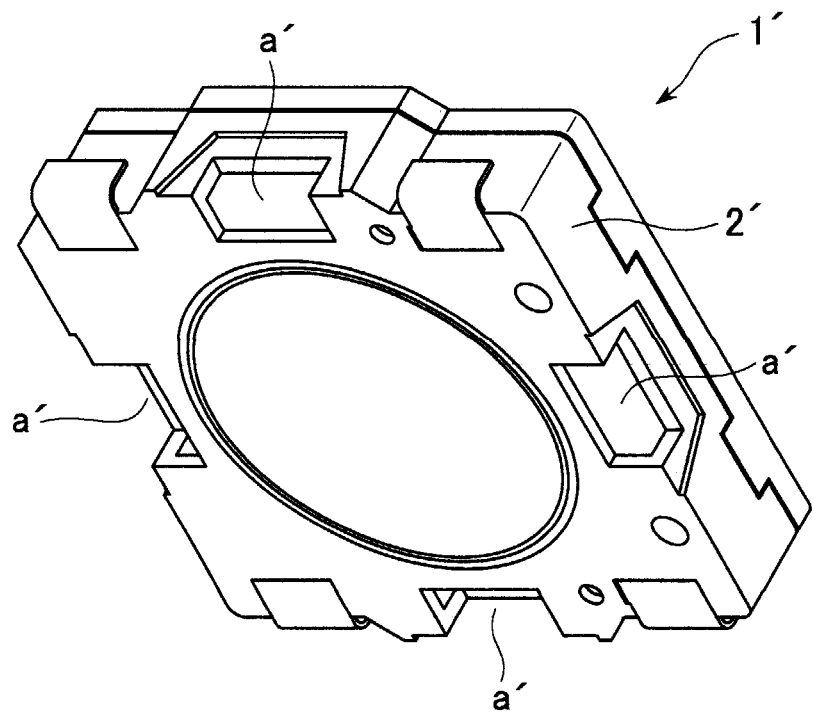
FIG. 13 illustrates a perspective view of the prior-art electroacoustic converter when seen from a bottom surface side.
Figure 14:
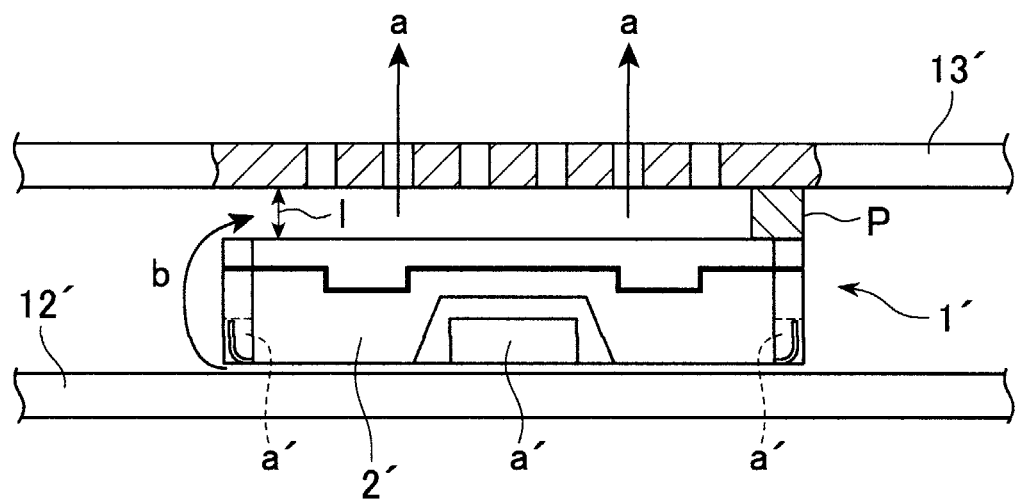
FIG. 14 is an operation explanatory view of a state where the assembly in which the prior-art electroacoustic converter is surface-mounted on the circuit board is arranged in the housing.

That is, in the electroacoustic converter 1' in the prior-art example, since the holes a' are formed as illustrated in FIG. 13, when the electroacoustic converter 1' is mounted on the circuit board 12' as illustrated in FIG. 11, leakage of the radiated sound b occurs on the front surface side of the circuit board 12', and as indicated by the broken line a in FIG. 9, the sound pressure lowers within a range of 300 to 6 kHz which is an important band. The sound leakage occurs even if the holes (not shown) similar to the holes 12*a* in FIG. 6 are formed in the circuit board 12'.

The slightly thicker broken line b in FIG. 9 represents a case where the side surface side of each hole a' is closed so that leakage of the diaphragm rear-surface radiated sound b to the circuit board front-surface side does not occur easily. This example shows the characteristic of such a constitution that the shape of the frame 2' of the electroacoustic converter 1' is worked so that the front surface of the circuit board 12' and the outer peripheral portion of the frame bottom surface are brought into contact with each other without a gap. However, in mass production, a similar characteristic cannot necessarily be obtained stably because a gap is generated between the frame 2' and the circuit board 12' due to a sink mark during frame molding or a solder state in mounting, or because of variation of the gap.

The solid line c of the present invention represents a characteristic in a case where lengths of the ventilation ports 5 are set to 0.25 mm and the distal ends of the ventilation ports are inserted into the through holes 12*a* of the circuit board 12. With this product, the sound pressure was not lowered in a practical range (300 to 6 kHz), and a favorable result could be obtained.

Besides, the lines d and e thicker than the solid line c represent cases where the lengths of the ventilation ports 5 are set to 1.0 mm and 2.0 mm, respectively, and the sound pressure was not lowered in these cases and stable characteristics were obtained.

Figure 10:
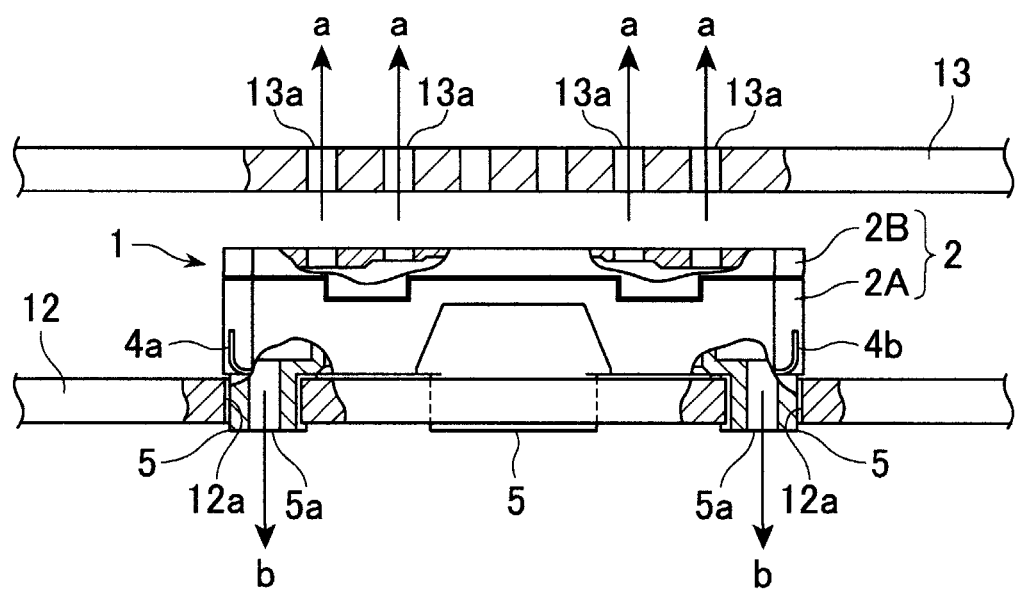
FIG. 10 is an operation explanatory view of the embodiment of an electroacoustic converter apparatus according to the present invention and showing a state where an assembly in which the electroacoustic converter is surface-mounted on the circuit board is arranged in a housing.

FIG. 10 illustrates an electroacoustic converter apparatus in a state where the assembly of the present invention in which the electroacoustic converter 1 is mounted on the circuit board 12 is accommodated inside the housing 13 such as a dashboard of an automobile, for example.

In the radiated sound from the assembly, sounds in opposite phases are separated to some degree and radiated to a mounting surface side and a rear surface side of the mounting surface. In incorporation in the housing 13, radiation holes are preferably provided so that either one of the radiated sounds can be radiated easily to the outside of the housing (radiated sound usage space). However, even if the radiation holes are not provided, the radiated sound is transmitted and does not cause a problem as long as a material of the housing 13 is resin or the like which is a light-weighted and molded relatively thin.

In the present invention, the radiated sound b from the rear surface of the diaphragm in the electroacoustic converter 1 can be reliably radiated to the lower side from the rear surface of the circuit board 12 through the ventilation holes 5a in the ventilation ports 5 on the rear surface side of the circuit board 12 in the housing 13. Therefore, the radiated sound b can be separated from the radiated sound a from the front surface of the electroacoustic converter 1, and the sound pressure of the radiated sound a from housing radiation holes 13a in the housing 13 is not lowered.

In the aforementioned embodiment, the example using the radiated sound from the diaphragm front surface side is described, but the radiated sound from the diaphragm rear surface, that is, a port radiated sound may be also used.

INDUSTRIAL APPLICABILITY

The present invention can be applied also to electroacoustic converters such as a microphone and a receiver, for example, other than the speaker.

REFERENCE SIGNS LIST 1 electroacoustic converter
2 frame
2A lower frame
2B upper frame
3 sound emission hole
4a to 4d terminal
5 ventilation port
5a ventilation hole
6 diaphragm
6a edge
7 voice coil
8 magnetic circuit
9 top plate
10 magnet
11 yoke
12 circuit board
12a through hole
12b conductive portion
13 housing

The invention claimed is:

1. An assembly comprising:
a circuit board having a front surface side and a rear surface side with a through hole extending therebetween; and
an electroacoustic converter mounted on the front surface side of the circuit board, the electroacoustic converter including a diaphragm surrounded on all sides by a frame;
wherein the frame has a sound emission hole in an upper surface thereof for radiating a radiated sound from a front surface of the diaphragm and has a terminal conductively fixed to the circuit board on a lower part of the frame;
wherein the frame includes a cylindrical ventilation port having a distal end projecting from the lower part of the frame, the ventilation port radiating a radiated sound from the rear surface of the diaphragm; and
wherein the distal end of the ventilation port is located at a position farther away from the diaphragm than a contact surface with the front surface side of the circuit board, the distal end of the ventilation port extending through the through hole in the circuit board such that positioning of the electroacoustic converted on the circuit board is facilitated and the radiated sound from the rear surface of the diaphragm is radiated from the rear surface side of the circuit board.

2. An electroacoustic converter apparatus comprising the assembly according to claim 1 inside a housing.

* * * * *